(12) United States Patent
Petrick et al.

(10) Patent No.: US 9,851,763 B1
(45) Date of Patent: Dec. 26, 2017

(54) SPACECUBE V2.0 MICRO SINGLE BOARD COMPUTER

(71) Applicant: The United States of America, as represented by the Administrator of the National Aeronautics and Space Administration, Washington, DC (US)

(72) Inventors: David J. Petrick, Severna Park, MD (US); Alessandro Geist, Bethesda, MD (US); Michael R. Lin, Ellicott City, MD (US); Gary R. Crum, Silver Spring, MD (US)

(73) Assignee: The United States of America as represented by the Administrator of the NASA, Washington, DC (US)

( * ) Notice: Subject to any disclaimer, the term of this patent is extended or adjusted under 35 U.S.C. 154(b) by 521 days.

(21) Appl. No.: 14/040,924

(22) Filed: Sep. 30, 2013

Related U.S. Application Data

(60) Provisional application No. 61/790,944, filed on Mar. 15, 2013.

(51) Int. Cl.
*H05K 1/18* (2006.01)
*G06F 1/18* (2006.01)
*H05K 1/02* (2006.01)
*H05K 1/11* (2006.01)

(52) U.S. Cl.
CPC .............. *G06F 1/185* (2013.01); *G06F 1/189* (2013.01); *H05K 1/0298* (2013.01); *H05K 1/115* (2013.01)

(58) Field of Classification Search
USPC .............................. 361/764, 679.32; 174/251
See application file for complete search history.

(56) References Cited

U.S. PATENT DOCUMENTS

| | | | | |
|---|---|---|---|---|
| 2006/0132481 A1* | 6/2006 | Brett | ........................ | H04N 9/64 345/418 |
| 2010/0045337 A1* | 2/2010 | Langton | ........... | G01R 31/31719 326/8 |
| 2011/0298342 A1* | 12/2011 | Li | ........................... | G06F 1/185 312/223.2 |
| 2013/0258624 A1* | 10/2013 | Hardin | ................... | H05K 1/184 361/773 |

* cited by examiner

*Primary Examiner* — Andargie M Aychillhum

(57) ABSTRACT

A single board computer system radiation hardened for space flight includes a printed circuit board having a top side and bottom side; a reconfigurable field programmable gate array (FPGA) processor device disposed on the top side; a connector disposed on the top side; a plurality of peripheral components mounted on the bottom side; and wherein a size of the single board computer system is not greater than approximately 7 cm×7 cm.

17 Claims, 6 Drawing Sheets

SPACECUBE V2.0 MICRO SINGLE BOARD COMPUTER

This application claims priority to Provisional Application No. 61/790,944, entitled "SPACECUBE 2.0 SYSTEM," filed Mar. 15, 2013. The content of this application is hereby incorporated by reference.

The invention described herein was made by an employee of the United States Government and may be manufactured and used by or for the Government of the United States of America for governmental purposes without the payment of any royalties thereon or therefor.

FIELD

The aspects of the present disclosure relate generally to electronic components for use in space flight, and in particular, to a compact design data processor suitable for space flight.

BACKGROUND

Many space-based science missions require "next generation" on-board processing capabilities to meet the specified goals of each mission. These missions use advanced instrumentation systems such as laser altimeter, radar, lidar, and hyper-spectral instruments, which require advanced on-board processing capabilities to facilitate the timely conversion of planetary or earth science data into planetary or earth science information. Currently available processing systems do not have the processing power required by these advanced information systems. Both an "order of magnitude" increase in processing power and the ability to "reconfigure on the fly" are required to implement algorithms that detect and react to events, to produce data products on-board for applications such as direct downlink, quick look, and "first responder" real-time awareness, to enable "sensor web" multi-platform collaboration, and to perform on-board "lossless" data reduction by migrating typical ground-based processing functions on-board, thereby reducing on-board storage and downlink requirements.

The SpaceCube™ is a reconfigurable, modular, compact, multi-processing platform for space flight applications demanding extreme processing power. It includes a Field Programmable Gate Array (FPGA) based on-board science data processing system developed at the NASA Goddard Space Flight Center (GSFC). The goal of the SpaceCube™ program is to provide one to two orders of magnitude improvements in on-board computing power while lowering relative power consumption and cost. The SpaceCube™ design strategy incorporates commercial radiation-tolerant FPGA technology and couples this technology with an upset mitigation software architecture to provide "order of magnitude" improvements in computing power over traditional radiation-hardened flight systems.

Achieving these goals will require using newly available FPGA and other devices, which have increased numbers of input and output (I/O) pins, and mounting these devices on both sides of each printed circuit board (PCB). Equipment area is a valuable commodity on space missions, therefore, it is also important to keep the PC boards as small as possible and increase the part density mounted on each board. Large improvements in processing capability leads to use of processing elements that require significant increase of the number of external interconnections needed on the processor boards. The existing connectors used for space flight do not provide the density of contacts needed to provide the increased interconnect requirements of the improved processing boards.

It is important to use high quality printed circuit boards (PCB) in equipment included in space missions. A PCB is an assembly that mechanically supports and electrically connects electronic components using conductive tracks, pads and other features etched from sheets of conductive material, typically copper or other suitable conductive metals, laminated onto a non-conductive substrate. To achieve a very high quality, PCBs intended for space flight are typically designed to meet industry quality standards such as IPC 6012B Class 3/A. IPC is a standards developing organization accredited by the American National Standards Institute whose aim is to standardize the manufacture of electronic equipment. Having a high quality PCB manufactured to well defined and trusted standards gives the customer a higher confidence that the PCB will survive the environmental stresses found in space and meet its life requirements. Until recently, designing to the Class 3/A standard has not been much of a problem. Modern PCBs often have multiple layers of conductive material and non-conductive substrate to allow muting of higher numbers of signals on densely populated boards. Designers typically use one side of the PCB for the majority of parts, and these "older" parts are in packages that make it fairly easy to meet the Class 3/A requirement. However, it is becoming more of a standard to use both sides of the board in order to reduce mass and increase performance. In addition, part manufacturers are cramming more I/O pins into packages and increasing the pin density per square inch. This makes designing to the Class 3/A quality standard difficult, especially for packages that contain 100 to 2000 pins. Using standard practices for building new-age space flight circuit boards currently adopted by space equipment providers such as GSFC makes it impossible to meet the Class 3/A requirements. PCB designs typically run into difficulty where changes made to meet one aspect of the Class 3/A standard cause other aspects to be violated thereby making it difficult and often impossible to meet the full requirements of the standard.

Typical space platforms, such as those developed in the SpaceCube™ program, require multiple boards to make up a complete system. In a space platform that has very strict size and weight requirements, the use of multiple electronic circuit boards can exceed these size and weight requirements. Additionally, the need to use multiple circuit boards to make up a complete data processing system increases design and packaging complexity.

Some programs can use commercial off the shelf components for its electronics. However, while some of these components may be smaller in size, they may be limited in their data processing performance. Other commercial products that may be small in size do not meet the stringent requirements for space flight. Also, computer processor and card architectures for use in space flight must also meet rigid requirements. Earth-space science missions require high end data computation and performance that is not available in other space processors. Processors and boards for space flight and missions must be configured in an architecture that is suited to handle radiation upsets while satisfying thermal and mechanical constraints and requirements.

Accordingly, it would be desirable to provide a single board computer system that addresses at least some of the problems identified above.

BRIEF DESCRIPTION OF THE DISCLOSED EMBODIMENTS

As described herein, the exemplary embodiments overcome one or more of the above or other disadvantages known in the art.

One aspect of the exemplary embodiments relates to a single board computer system radiation hardened for space flight. In one embodiment, the single board computer system includes a printed circuit board having a top side and bottom side; a reconfigurable field programmable gate array (FPGA) processor device disposed on the top side; a connector disposed on the top side; a plurality of peripheral components mounted on the bottom side; and wherein a size of the single board computer system is not greater than approximately 7 cm×7 cm.

Another aspect of the disclosed embodiments is directed to a multi-layer printed circuit board for a single board radiation hardened processing system. In one embodiment, the multi-layer printed circuit board includes a top half a bottom half, and a center plane therebetween. A layout stack-up of the multi-layer printed circuit board has a pair of ground layers, a pair of signal layers and a pair of power layers on the top half and the bottom half of the printed circuit board, a top layer and a bottom layer of the printed circuit board including land pads for connecting electrical components to the printed circuit board.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the present disclosure, and together with the general description given above and the detailed description given below, serve to explain the principles of the present disclosure. As shown throughout the drawings, like reference numerals designate like or corresponding parts.

DETAILED DESCRIPTION

Figure 1:
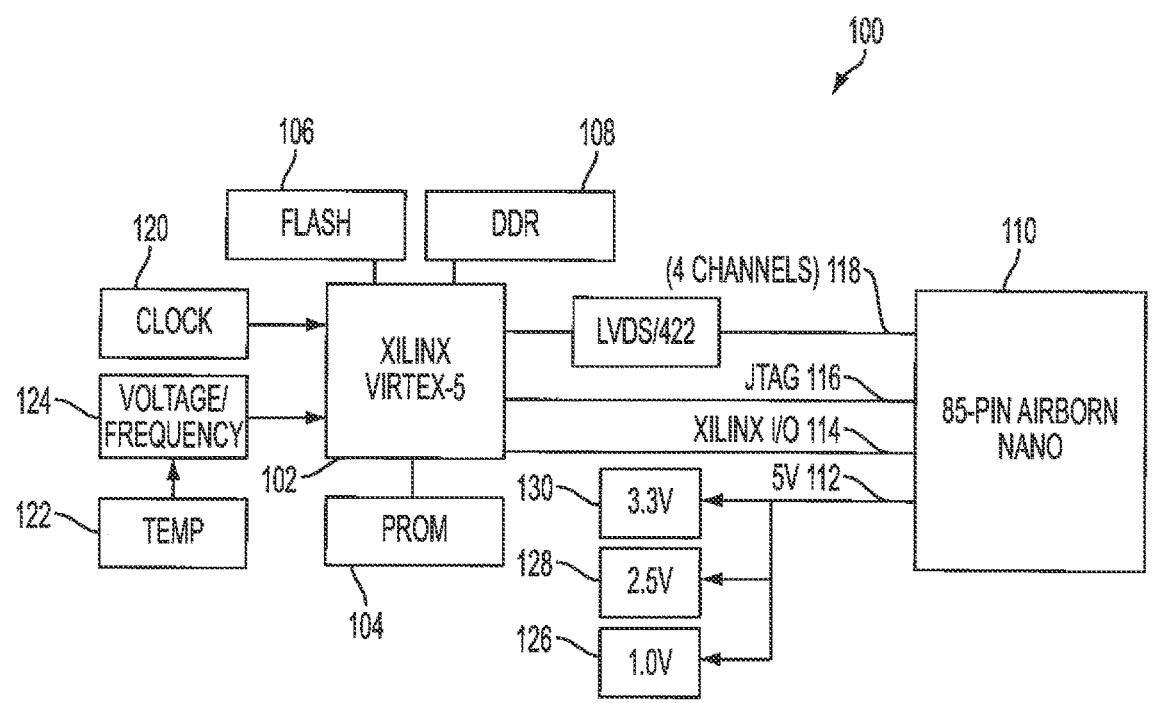
FIG. 1 illustrates a schematic block diagram of one embodiment of a system incorporating aspects of the present disclosure.

Referring to FIG. 1, a block diagram of one embodiment of a single board computer system 100, including aspects of the disclosed embodiments is illustrated. The aspects of the disclosed embodiments are directed to an extremely small, low power, reconfigurable FPGA multi-processor system that is based on the Xilinix Virtex-5 FX130T form factor and is suitable for space flight. The single board computer system 100 of the disclosed embodiments is directed to small systems that require significant data processing capability and is built with radiation tolerant and/or hardened space quality parts. A unique layout strategy of the printed circuit board allows for unlike parts to be placed in a back-to-back configuration to minimize the real estate of the printed circuit board, also referred to as a printed wiring board. Although the embodiments disclosed herein will be described with reference to the drawings, it should be understood that the embodiments disclosed herein can be embodied in many alternate forms. In additional any suitable size, shape or type of elements or materials could be used.

As is illustrated in FIG. 1, in one embodiment, the single board computer system 100 includes a field programmable gate array (FPGA) device 102. In one embodiment, the FPGA device 102 is the Xilinx Virtex-5 QR FX130T FPGA 102, manufactured by XILINX, Inc., which is a high performance radiation hardened reconfigurable field programmable gate array for processing computation-intensive space systems. In one embodiment, the single board computer system 100 of the disclosed embodiments is configured to execute 3,000 millions of instructions per second (MIPS), which is more than ten times greater than other comparable space processors.

While the aspects of the disclosed embodiments will be generally described with respect to the Xilinix FPGA, the aspects of the disclosed embodiments are not so limited, and any suitable reconfigurable processor that meets the strict size, weight, processing capability and power requirements, as are generally described herein, can be implemented in the single board computer system 100. For example, in one embodiment, FPGA device 102 is a commercial version of the Xilinix FPGA that includes two PowerPC440 processor cores.

The other peripheral components or devices that are used with the single board computer system 100 of the disclosed embodiments are selected to maximize the use of the system 100 with a small electronics or printed circuit board. In one embodiment, the peripheral devices or components can include a programmable read only memory (PROM) device 104 for configuring the Xilinx FPGA, such as a 64 Mb PROM, a flash memory device 106, such as 32 Gb flash memory for holding the software application and other user data, and a double data rate synchronous dynamic random-access memory (DDR SDRAM) device 108, such as a 256 Mb DDR SDRAM for storing an operating system and dynamic application data, such as images or attached instrument data, for example. The capacities of the peripheral components referenced herein are merely exemplary, and in alternate embodiments, any suitable capacity devices can be used.

In one embodiment, the single board computer system 100 includes a single connector 110. In the example shown in FIG. 1, the connector 110 is a surface mount type of connector. The use of a surface mount connector 110 can conserve space. In alternate embodiments, any suitable type of connector can be used that provides the required functionality as is generally described herein, while minimizing space and weight. One example of such a connector 110 is the Airborn 85-pin Nano connector, manufactured by Air-Born Inc.

In one embodiment, the connector 110 is configured to provide connections or ports for the system, which include for example, a power connection 112, a Xilinix I/O (16 channel) connection 114, a JTAG (IEEE-1149.x Standard) port 116 and a low voltage differential signaling (LVDS) or RS422 port 118. In the example shown in FIG. 1, the power connection 112 can provide a 5 volt power supply, which can be stepped down or reduced to one or more of 3.3 volts, 2.5 volts, and 1.0 volts, depending upon the requirements of the single board computer system 100. In alternate embodiments, the connector 110 can provide any suitable connections.

Other peripheral components of the single board computer system 100 shown in FIG. 1 can include a clock 120, temperature sensor 122 such as a thermistor or Positive Temperature Coefficient (PTC) thermistor, and a voltage to frequency converter 124. In alternate embodiments, the peripheral components can include such other components as needed to support the user application of the single board computer system 100 that satisfy the requirements as are generally described herein.

The single board computer system 100 of the disclosed embodiments will generally require approximately 4 to 6 volts to operate and will draw approximately 5 watts or less. In one embodiment, in order to reduce the power requirements of the single board computer system 100, switching regulators 126, 128 are used for higher power voltage loads rather than linear regulators. Switching regulators 126 and 128 provide 1.0V and 2.5V, respectively. A linear regulator 130 provides 3.3V. This enables power regulation to take place within the single board computer system 100 and eliminates the need for a separate power board.

Radiation mitigation is possible with the single board computer system 100 of the disclosed embodiments. The FPGA 102, which in this example is the Xilinix, in the system 100 will be configured to monitor and fix (scrub) its own configuration. If desired, external scrubbing is an option via the JTAG port 116. The PROM 104 is radiation hardened so that the initial configuration of the Xilinix FPGA 102 is protected. The software and data files in the flash memory 106 can be stored in a redundant fashion in order to protect against radiation upsets. In one embodiment, the single board computer system 100 is reconfigurable via a "hardware bootloader." In this example, the PROM 104 can include a design that is configured to load a subsequent design via the flash memory 106 using a partial reconfiguration method.

The typical size of the Xilinx FPGA is approximately 5 centimeters×5 centimeters. The size of the single board computer system 100 of the disclosed embodiments is configured to be slightly larger. In one embodiment, referring to FIG. 2 for example, the single board computer system 100 of the disclosed embodiments has a size of approximately 7 centimeters×7 centimeters. The size of the single board computer system 100 is configured to accommodate the connector 110 and provide a way to secure the single board computer system 100 within a suitable structure.

Figure 2:
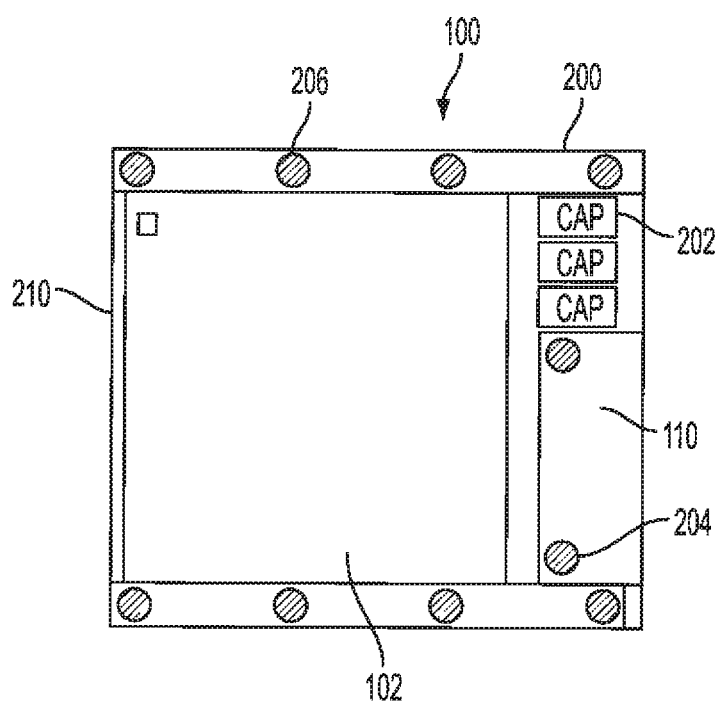
FIG. 2 illustrates a top side view of an embodiment of a system incorporating aspects of the present disclosure.

FIG. 2 illustrates a top side view of one embodiment of the single board computer system 100. In this example, the top side 200 includes the FPGA 102, the connector 110. In one embodiment, the top side 200 can include other electronic components, such as capacitors 202. The top side 200 can also including mounting holes 204 for securing the connector 110 to the electronics circuit board 210 to which the components of the single board computer system 100 are mounted. Other through holes or thermal board interfaces or mounting holes 206 are provided for securing or clamping the single board computer system 100 within a suitable frame or connector structure. The thermal board interfaces or mounting holes 206 can provide a primary heat path from the electronics circuit board 210 to the frame or other heat sink. A secondary heat path would involve installing a thermal strap or bond from the packaging of the higher power devices to a heat sink.

Figure 3:
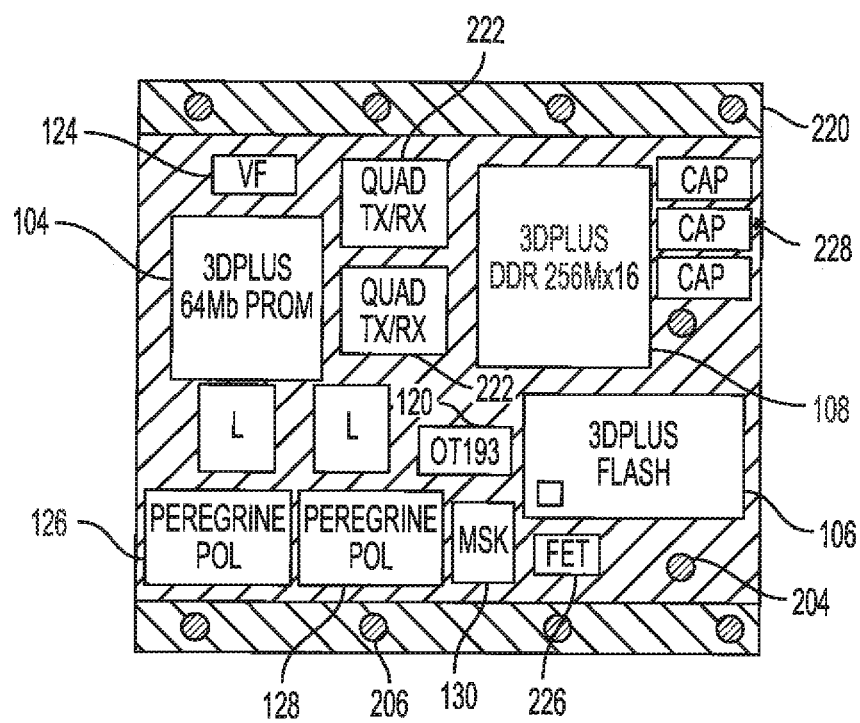
FIG. 3 illustrates a bottom side view of one embodiment of a system incorporating aspects of the disclosed embodiments.

FIG. 3 is a bottom side view of the single board computer system 100 and the electronics board 210. In one embodiment, all of the peripheral parts or components of the single board computer system 100 are mounted on the bottom or back side 220 of the electronics board 210. In this example, the components mounted on the back side 220 include a PROM 104, a flash memory 106, a DDR SDRAM 108, oscillator or clock 120, a voltage-frequency converter 124, one or more transmit/receive devices 222, one or more switching power units 126, 128, linear switching unit 130, a MOSFET device 224, and capacitors 228. In alternate embodiments, the back side 220 of the single board computer system 100 can include such other suitable components and devices as required for the particular user application.

The single board computer system 100 of the disclosed embodiments employs a unique layout strategy that uses blind vias, symmetrical layer stackup, localized FPGA via breakouts and trace routing. In one embodiment, together with mechanical packaging, the single board computer system 100 can have a size that is less than approximately 7 cubic inches, or approximately 3 inches×3 inches×0.75 inches.

In the single board computer system 100 described with reference to FIG. 1 above, a pair of large FPGA devices are used to provide redundant processing power and support the software mitigation functionality. These FPGA are packaged in 1752-pin CGA devices where the I/O pins are arranged in a uniform 42 by 42 pin matrix with a 1 mm pitch. One major goal of the processing system 100 design technology is to keep board sizes as small as possible. To achieve this, two of the 1752 pin CGA devices are mounted in a back-to-back arrangement on opposite sides of the processor card 108, which further complicates the ability to lay out a Class 3/A board. In order to use the 1752-pin CGA devices, there must be many signal layers so that all of the pins can escape from beneath the 42×42 pin matrix. A back-to-back arrangement is where two CGA devices having the same pin matrix configuration are physically located directly opposite each another on the top and bottom of the PCB such that the pins of each device line up. A back-to-back arrangement inherently requires a thicker board because there are twice as many signals needing to escape from beneath the back-to-back devices. Thus, the back-to-back arrangement makes it impossible to breakout signals using a standard via breakout, while at the same time meeting Class 3/A quality standards.

Figure 4:
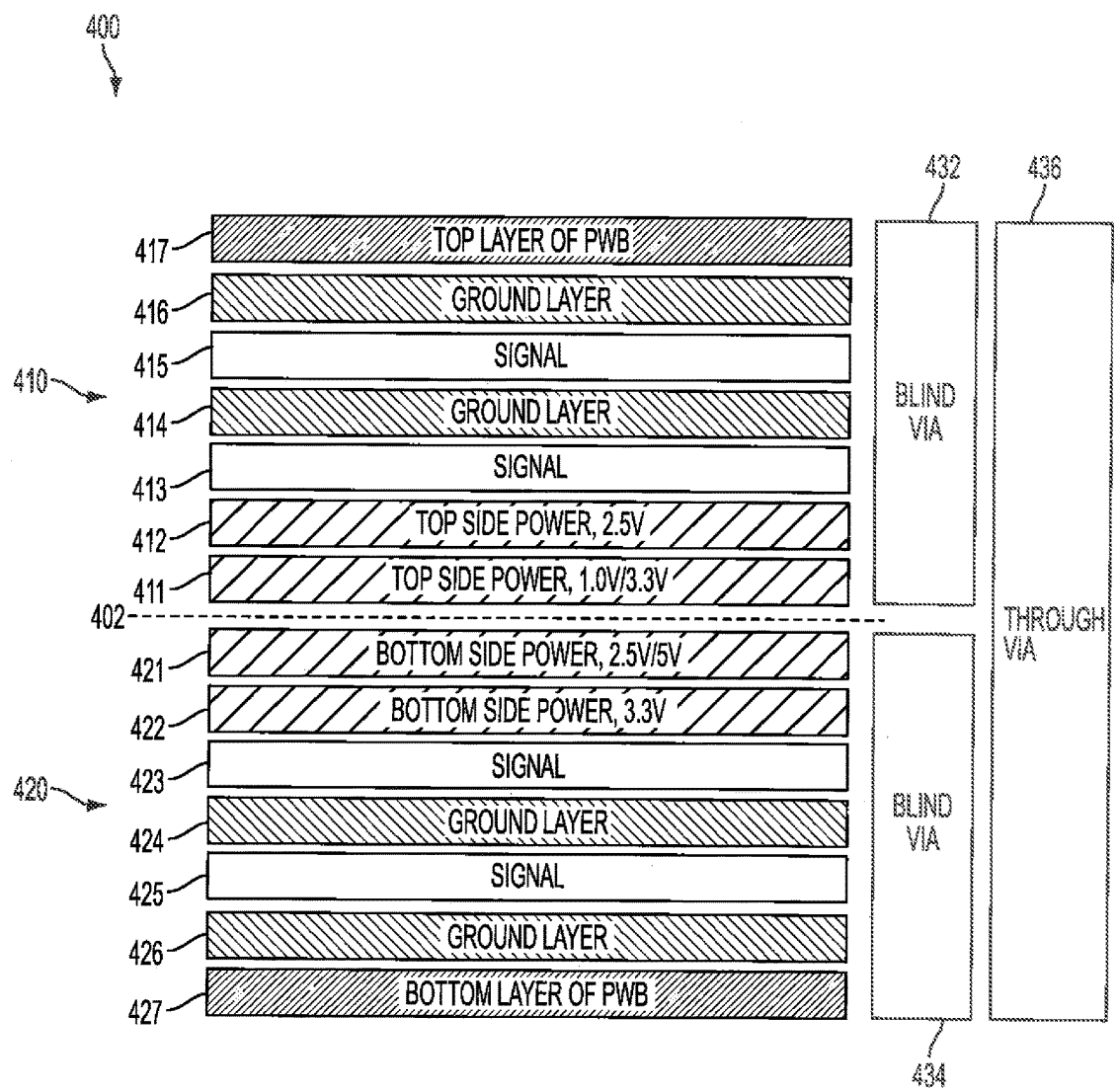
FIG. 4 illustrates a schematic diagram of one embodiment of two-halves of a printed circuit board layout stack-up for a system incorporating aspects of the present disclosure.

FIG. 4 illustrate one embodiment of the stack-up layout 400 of the electronic circuit board 210, also referred to as a printed circuit board (PCB) or printed wire board (PWB), for the single board computer system 100. The layers of the PCB 210 are arranged symmetrically about a central plane 402, which is coplanar with the PCB 210. The embodiment of the circuit board 210 in FIG. 4 is a multi-layer PCB configured in a two halves configuration. In this example, reference 402 indicates an approximate center or central plane of the board 210, the top half being referenced as 410 and the bottom half as 420. The "two halves" configuration is a multi-layer PCB layer configuration used to support back-to-back mounting of similar column grid array (CGA) devices, where the layers of the PCB are arranged symmetrically about a central plane 402, which is coplanar with the PCB. In the two-halves configuration, the bottom half 420 can have the same configuration of layers as the top half 410, mirrored about the central plane 402. The top layer 417 of the circuit board 210 and bottom layer 427 in the layout 400 include the mounting or land pads for connecting electronic components to the PCB 210 as well as signal paths and other features. The term "feature" refers to a geometry of the conductive material and insulating layers formed on or within the PCB 210.

The stack-up layout 400 shown in FIG. 4 includes 14 layers. Four of the layers are ground layers, referenced as 414, 416, 424, 426, four power layers 411, 412, 421, 422, four signal layers 413, 415, 423, 425, a top layer 417 and a bottom layer 427. The power layers 411, 412 and 421, 422 are positioned near the center plane 402 of the board 210 to eliminate split planes being the signal reference.

The stack-up layout 400 of FIG. 4 also includes blind vias 432, 434 and through-via, or through-hole via 436. With the two-halves board configuration shown in the layout 400 of FIG. 4, many of the via-in-pad features require only blind vias 432, 434 going no more than halfway through the board 210 allowing a smaller via diameter to be used. A through via 436 is used to connect similarly located pins on each of the devices in a back-to-back arrangement of CGA devices.

Certain considerations must be addressed in the layout stack-up of the electronic circuit board 210. Some of these considerations include:

Use of via-in-pad or micro-vias required to breakout the FPGA 102.

Vias on the opposite side of the FPGA 102 must be minimized.

All power and ground connections are made using blind vias, such as 432, 434.

All signals going to the connector 110 must use blind vias, such as 432, 434.

All signals going to a component on the opposite side of the board 210 must use a through-hole via, such as 436.

The part placement of the peripheral components on the bottom side 220 of the board 210 must be such so that the through-hole vias for the FPGA are localized under each component.

The peripheral components, such as those shown in FIG. 3, can use blind vias for electrical connections.

The switching power device 224 shown in FIG. 3 can use through-hole vias that are aligned with the FPGA 102 via break out.

2.5 volt and 3.3 volt and ground via stitching occurs outside a boundary of the FPGA 102.

Signal layers may require a reordering of pinouts in order to allow maximum use of routing to eliminate any unnecessary vias.

Figure 5:
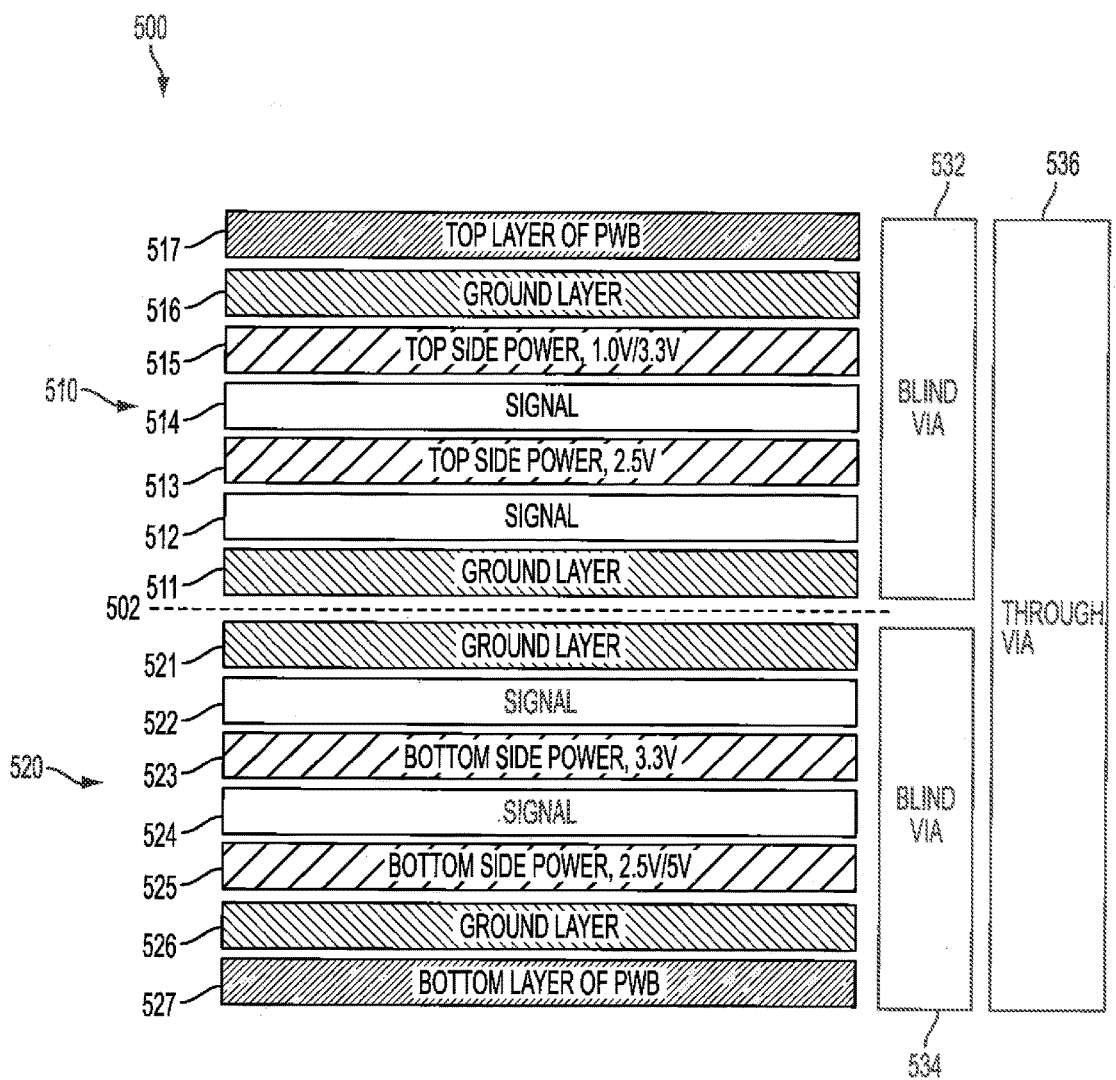
FIG. 5 illustrates a schematic diagram of another embodiment of a printed circuit board layout stack-up for a system incorporating aspects of the present disclosure.

FIG. 5 illustrates another exemplary layout stack-up 500 of the electronic circuit board 210 of FIG. 2. The stackup 500 is also a two-halves configuration, with a top half 510 and a bottom half 520 arranged substantially symmetrically about a central plane 502. In this embodiment, the layout stack-up 500 also includes 14 layers, four ground 511, 516, 521, 526; four power 513, 515, 523, 525; four signal 512, 514, 522, 524; a top layer 517, and a bottom layer 527. In the example of FIG. 5, the power layers 513, 515, 523, 525 are closer to the top to improve power integrity. However, care must be taken to avoid split planes. The embodiment of FIG. 5 also includes blind vias 532, 534 and through-hole via 536.

Figure 6:
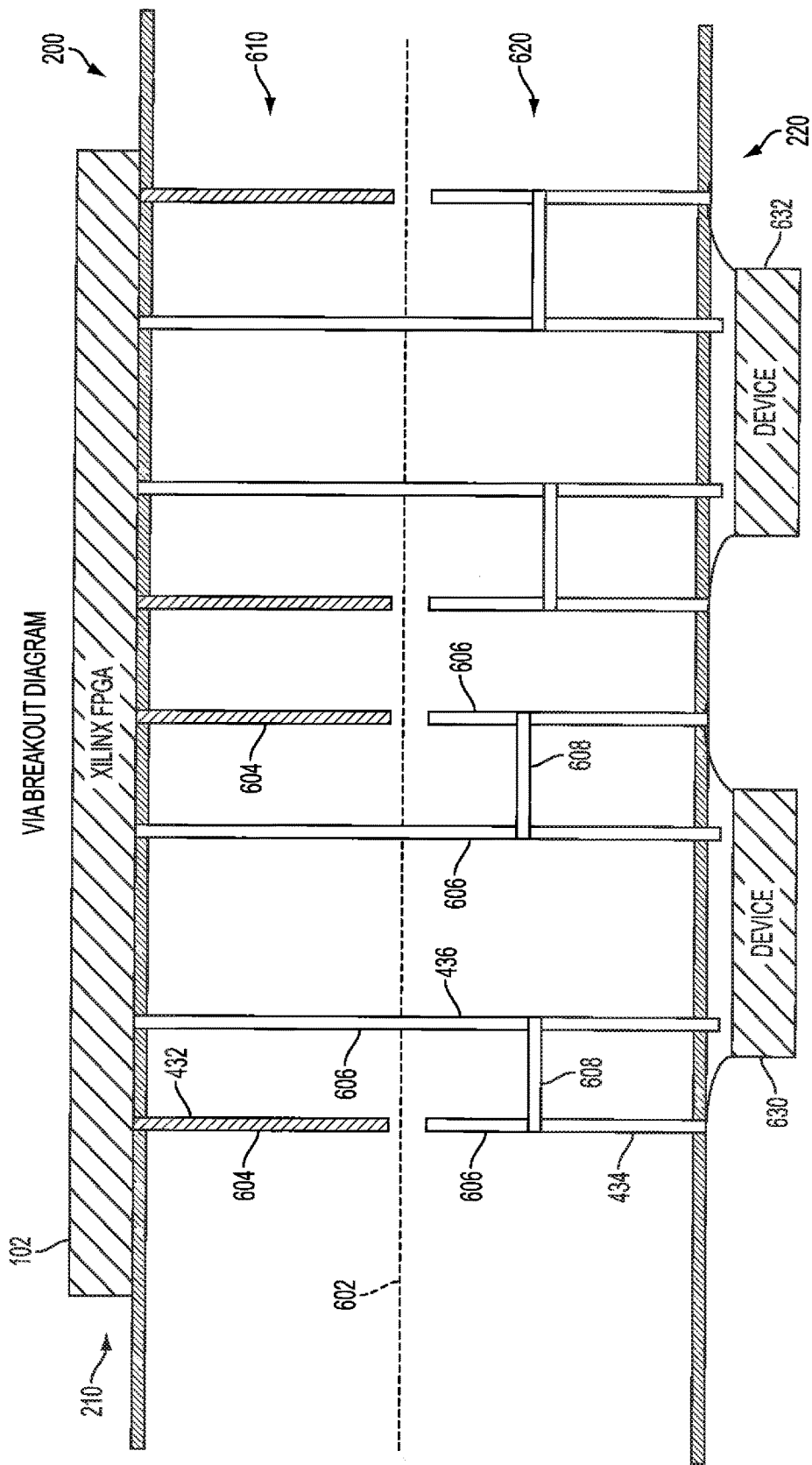
FIG. 6 illustrates a schematic view a via breakout layout for one embodiment of a printed circuit board layout stack-up for a system incorporating aspects of the present disclosure

FIG. 6 illustrates an exemplary via breakout diagram for one embodiment of the electronic circuit board 210 illustrated in FIGS. 2 and 3. The power and ground vias are generally referenced as 604, while the signal breakout vias are referenced as 606. An approximate center or center plane of the electronic circuit board 210 is referenced as 602, which divides the electronic circuit board 210 into an upper or top portion 610, and a lower or bottom portion 620.

As shown in the FPGA device 102 is disposed on the top side 200 of the electronic circuit board 210. Peripheral components or devices 630, 632, are disposed on the bottom side 220 of the electronic circuit board 210. In the example of FIG. 6, the power and ground vias 604 in the top portion 610 are blind vias 432, while the signal breakout vias 606 in the bottom portion 620 include a combination of blind vias 434 and through vias 436.

In order to accommodate the through vias 436, the devices 630, 632 are offset or raised above a surface of the bottom side 220 of the electronic circuit board 210. The devices 630, 632 need to positioned or placed to allow for the through vias 436 to "pop" through, without either electrically or physically contacting the bottoms of the devices 630, 632. In one embodiment, the devices 630, 632 are positioned a distance above the surface of the bottom side 220 of the electronic circuit board 210 that is greater than approximately 0.010 inches. In alternate embodiments, the devices 630, 632 can be positioned at any suitable distance above the surface of the bottom side 220 of the electronic circuit board 210 that can ensure that the bottoms of the devices 630, 632 do not make either electrical or physical contact with the through vias 436 that pop through under the devices 630, 632.

The orientation of the FPGA device 102 on the top side 200 of the electronic circuit board 210 does not allow for through vias to be used from the bottom side 220. The I/O vies 608 are then "clustered" underneath each one of the bottom side 220 devices 630, 632. Traces on the bottom side 220 of the electronic circuit board 210 stackup to connect the through vias 436 to a blind via 434 in the desired fashion.

In one embodiment, the single board computer system 100 of the disclosed embodiments can find application in a CubeSat. The CubeSat is a very small or type of miniaturized satellite for space research. The size of the CubeSat is on the order of approximately 10 centimeters×10 centimeters×10 centimeters. It has a mass of up to approximately 1.33 kilograms. The electronics and other components of the CubeSat must be very small in order to meet the strict size and weight requirements. In addition to being very small, the power requirements are very limited in a CubeSat. Other applications of the single board computer 100 of the disclosed embodiments, can include, but are not limited to small free flyer satellite systems, balloons, sounding rockets and other unmanned aerial vehicles (UAVs), and small instruments that require high end data processing.

The aspects of the disclosed embodiments provide a single board computer suitable for space flight that has a very small packaging form factor and can fit almost anywhere in any system. It is intended for systems requiring low power, but a very power data processor, such as a single board computer configured for space flight. The layout technique of the electronics circuit board enables the single board computer of the disclosed embodiments to achieve the needed small size. The single board computer of the disclosed embodiments does not support plug-in I/O cards. The aspects of the disclosed embodiments reduce the size of the electronics board of the single board computer to the smallest possible form factor, while yielding a useful and functional processor design. Memory and I/O resources are available to support the particular application of the single board computer of the disclosed embodiments. In one embodiment, the power requirements of the single board computer can be limited in order to target systems that do not have a large power budget.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A single board computer system radiation hardened for space flight, the single board computer system comprising:
   a printed circuit board, the printed circuit board having a top side and bottom side, the printed circuit board comprising a plurality of layers arranged symmetrically in a two-halves configuration above and below a central plane of the printed circuit board;
   a field programmable gate array (FPGA) processor device disposed on the top side;
   a connector disposed on the top side; and
   a plurality of peripheral components mounted on the bottom side,
   wherein a size of the single board computer system is not greater than approximately 7 cm×7 cm, and
   wherein a layout stack-up of the printed circuit board comprises fourteen layers including four ground layers, four power layers, four signal layers, a top layer, and a bottom layer.

2. The single board computer system of claim 1, wherein the single board computer system is configured to execute 3,000 millions of instructions per second (MIPS).

3. The single board computer system of claim 1, wherein the FPGA processor device is a Xilinix device.

4. The single board computer system of claim 1, wherein the connector comprises a surface mount connector.

5. The single board computer system of claim 1, wherein the plurality of peripheral components mounted on the bottom side include a PROM device, a flash memory device, a DDR SDRAM device, voltage/frequency oscillator, at least one voltage regulator, and at least one electrical interface.

6. The single board computer system of claim 1, wherein the layout stack-up of the printed circuit board comprises power layers adjacent a center of the printed circuit board.

7. The single board computer system of claim 1, wherein the layout stack-up of the printed circuit board comprises power layers adjacent to the top layer of the printed circuit board.

8. The single board computer system of claim 1, comprising at least one through-hole via connecting the FPGA processor to a signal layer on the bottom side of the printed circuit board.

9. The single board computer system of claim 8, wherein a placement of a plurality of peripheral components on the bottom side of the printed circuit board localizes the at least one through-hole via connecting the FPGA processor to the signal layer under the peripheral components.

10. A single board computer system radiation hardened for space flight, the single board computer system comprising:
   a printed circuit board, the printed circuit board having a top side and bottom side, the printed circuit board comprising a plurality of layers arranged symmetrically in a two-halves configuration above and below a central plane of the printed circuit board;
   a field programmable gate array (FPGA) processor device disposed on the top side;
   a connector disposed on the top side; and
   a plurality of peripheral components mounted on the bottom side,
   wherein a size of the single board computer system is not greater than approximately 7 cm×7 cm,
   wherein the layout stack-up of the top side of the printed circuit board comprises:
   a first power layer;
   a second power layer over the first power layer;
   a first signal layer over the second power layer;
   a first ground layer over the first signal layer;
   a second signal layer over the first ground layer;
   a second ground layer over the second signal layer; and
   a top layer of the printed circuit board over the second ground layer.

11. The single board computer system of claim 10, wherein the layout stack-up of the bottom side of the printed circuit board comprises:
   a first power layer;
   a second power layer over the first power layer;
   a first signal layer over the second power layer;
   a first ground layer over the first signal layer;
   a second signal layer over the first ground layer;
   a second ground layer over the second signal layer; and
   a top layer of the printed circuit board over the second ground layer.

12. A multi-layer printed circuit board for a single board radiation hardened processing system, the multi-layer printed circuit board comprising:
   a top half;
   a bottom half; and
   a center plane therebetween; and
   a layout stack-up of the multi-layer printed circuit board, the layout stack-up comprising:
   a pair of ground layers,
   a pair of signal layers, and
   a pair of power layers on the top half and the bottom half of the printed circuit board; a top Layer and a bottom layer of the printed circuit board including a plurality of land pads for connecting electrical components to the printed circuit board, the printed circuit board comprising a plurality of layers arranged symmetrically in a two-halves configuration above and below a central plane of the printed circuit board,
wherein the stack-up layout comprises the pairs of power layers being positioned near the top layer and the bottom layer, respectively, and
wherein the top and bottom layer of the stack-up layout comprise:
a first ground layer adjacent the center plane of the multi-layer printed circuit board; a first signal layer over the first ground layer;
a first power layer over the first signal layer;
a second signal layer over the first power layer;
a second power layer over the second signal layer; and
a second ground layer over the second power layer,
wherein the top layer and the bottom layer of the printed circuit board are over respective ones of the second power layer.

13. The multi-layer printed circuit board of claim 12, wherein the stack-up Layout comprises the pairs of power layers being positioned near the center plane of the multi-layer circuit board.

14. The multi-layer printed circuit board of claim 13, wherein the top and bottom layer of the stack-up layout comprise:
a first signal layer adjacent the pair of power layers;
a first ground layer over the first signal layer;
a second signal layer over the first ground layer;
a second ground layer over the second signal layer; and
wherein the top layer and the bottom layer of the printed circuit board are over respective ones of the second ground layer.

15. The multi-layer printed circuit board of claim 14, the multi-layer printed circuit board further comprising:
a plurality of blind vias and a plurality of through-vias to connect similarly located pins in a back-to-back arrangement of CGA devices.

16. The multi-layer printed circuit board of claim 12, the multi-layer printed circuit board further comprising:
a plurality of blind vias and a plurality of through-vias to connect similarly located pins in a back-to-back arrangement of CGA devices.

17. A multi-layer printed circuit board for a single board radiation hardened processing system, the multi-layer printed circuit board comprising:
a top half;
a bottom half; and
a center plane therebetween; and
a layout stack-up of the multi-layer printed circuit board, the layout stack-up comprising:
a pair of ground layers,
a pair of signal layers, and
a pair of power layers on the top half and the bottom half of the printed circuit board; a top layer and a bottom layer of the printed circuit board including a plurality of land pads for connecting electrical components to the printed circuit board, the printed circuit board comprising a plurality of layers arranged symmetrically in a two-halves configuration above and below a central plane of the printed circuit board,
a reconfigurable field programmable gate array (FPGA) processor device and a connector disposed on the top side disposed on the top side of the multi-layer printed circuit board; and a plurality of peripheral components mounted on the bottom side of the multi-layer printed circuit board,
wherein a size of the single board radiation hardened processing system is not greater than approximately 7 cm×7 cm; and
the single board radiation hardened processing system is configured to execute 3,000 millions of instructions per second (MIPS).

* * * * *